(12) United States Patent
Lim

(10) Patent No.: US 7,492,401 B2
(45) Date of Patent: Feb. 17, 2009

(54) CORRELATED-DOUBLE-SAMPLING (CDS) WITH AMPLIFICATION IN IMAGE SENSING DEVICE

(75) Inventor: Su-Hun Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 616 days.

(21) Appl. No.: 11/046,946

(22) Filed: Jan. 31, 2005

(65) Prior Publication Data

US 2005/0168601 A1 Aug. 4, 2005

(30) Foreign Application Priority Data

Feb. 3, 2004 (KR) .................. 10-2004-0006981

(51) Int. Cl.
- H04N 5/217 (2006.01)
- H04N 3/14 (2006.01)
- H04N 5/335 (2006.01)

(52) U.S. Cl. ...................... 348/300; 348/241
(58) Field of Classification Search .............. 348/241, 348/294, 300–302, 308; 250/208.1; 341/155
See application file for complete search history.

(56) References Cited

U.S. PATENT DOCUMENTS

| | | | |
|---|---|---|---|
| 4,398,099 A | 8/1983 | Benoit-Gonin et al. ...... 307/246 |
| 5,844,431 A | 12/1998 | Chen ........................... 327/94 |
| 6,529,237 B1 | 3/2003 | Tsay et al. .................. 348/241 |
| 6,587,143 B1 * | 7/2003 | Boisvert ..................... 348/241 |
| 6,727,486 B2 * | 4/2004 | Choi ......................... 250/208.1 |
| 6,895,256 B2 * | 5/2005 | Harma et al. ............. 455/556.1 |
| 7,068,312 B2 * | 6/2006 | Kakumoto et al. .......... 348/241 |
| 7,242,427 B2 * | 7/2007 | Kokubun et al. ............ 348/241 |
| 7,245,321 B2 * | 7/2007 | Panicacci et al. ............ 348/241 |
| 7,289,145 B2 * | 10/2007 | Johnson et al. .......... 348/229.1 |
| 2005/0206752 A1 * | 9/2005 | Lim ........................... 348/241 |

OTHER PUBLICATIONS

Japanese Patent No. JP2000032342 to Mizuno et al., having Publication date of Nov. 14, 2001 (w/ English Abstract page).
Japanese Patent No. JP2003169257 to Kenichi et al., having Publication date of Jun. 13, 2003 (w/ English Abstract page).
European Patent Application No. 00117392.1 to Wayne, having Publication date of Mar. 7, 2001.

* cited by examiner

Primary Examiner—Lin Ye
Assistant Examiner—Daniel M Pasiewicz
(74) Attorney, Agent, or Firm—Monica H. Choi

(57) ABSTRACT

A correlated double sampling (CDS) amplifier for an image sensing device includes a plurality of capacitors and a switching network coupled to the plurality of capacitors and to a pixel of the image sensing device. The switching network is configured to couple the capacitors in parallel as an initial CDS difference voltage is generated, and then is configured to couple the capacitors in series for generating a final CDS difference voltage that is a multiple of the initial CDS difference voltage.

17 Claims, 7 Drawing Sheets

CORRELATED-DOUBLE-SAMPLING (CDS) WITH AMPLIFICATION IN IMAGE SENSING DEVICE

BACKGROUND OF THE INVENTION

This application claims priority to Korean Patent Application No. 2004-6981, filed on Feb. 3, 2004, in the Korean Intellectual Property Office, the disclosure of which is incorporated herein in its entirety by reference.

1. Field of the Invention

The present invention relates generally to image sensors, and more particularly to a correlated double sampling (CDS) amplifier for a complementary metal oxide semiconductor (CMOS) image sensor for improving signal to noise (S/N) ratio.

2. Description of the Related Art

A complementary metal oxide semiconductor (CMOS) image sensor (CIS) has a number of advantages over a charge-coupled device (CCD), including low driving voltage, low power consumption, fabrication from a standard CMOS process, and high integration. Therefore, the CIS is likely to replace the CCD in the future.

However, unlike the CCD, the CIS requires a high-resolution analog-to-digital converter (ADC) for converting an analog signal received from an active pixel sensor (APS) to a digital signal.

Conversion of an analog signal to a digital signal is carried out using a single ADC or column ADCs. In the case of the former, analog signals received from APSs of all columns are converted within a predetermined time to digital signals by a single ADC driven at high speed. Therefore, the chip area of the ADC is minimized. However, since the ADC is driven at high speed, power consumption of the CIS disadvantageously increases. On the other hand, in the case of the latter, simple structural ADCs are arranged in a column-wise fashion and consume less power but have increased chip area.

For high performance, the signal to noise ratio (S/N ratio) of the CIS is desired to be maximized. In this respect, almost all CISs use a correlated double sampling (CDS) method. In the CDS method, a reset voltage and a signal voltage are generated from a pixel of the APS array, and a difference between the reset voltage and the signal voltage indicates the intensity of light sensed by the pixel. With such a CDS method, the CIS removes fixed pattern noise or low frequency noise, thereby improving the S/N ratio. Here, the "reset voltage" indicates a voltage generated by the APS during reset sampling and the "signal voltage" indicates a voltage generated by the APS during signal sampling.

The ADC converting an analog signal from the CDS method to a digital signal also determines the S/N ratio of the CIS. For example, a range of the analog signal converted by the ADC is desired to be higher for enhanced S/N ratio of the CIS.

SUMMARY OF THE INVENTION

Accordingly, an image sensing device includes a pixel for generating a reset voltage and an image signal voltage. In addition, a correlated double sampling (CDS) amplifier generates an initial CDS difference voltage as a difference between the reset voltage and the image signal voltage, and further generates a final CDS difference voltage that is a multiple of the initial CDS difference voltage. An analog-to-digital converter converts the final CDS difference voltage that is an analog signal into a digital signal.

In an example embodiment of the present invention, the CDS amplifier includes a plurality of capacitors and a switching network coupled to the plurality of capacitors and to the pixel. Furthermore, a controller of the image sensing device configures the switching network to couple the capacitors in parallel as the initial CDS difference voltage is generated, and then to couple the capacitors in series for generating the final CDS difference voltage.

In one embodiment of the present invention, the final CDS difference voltage is N times the initial CDS difference voltage, with N being an integer. In that case, the plurality of capacitors includes a first set of N capacitors coupled to a ramp signal generator and to the pixel, and includes a second set of N capacitors coupled to the pixel and an output node that generates an input voltage for the analog-to-digital converter. In addition, the switching network includes a pixel sampling switch coupled between the pixel and each of the first and second set of N capacitors.

In a further embodiment of the present invention, the ramp signal generator generates an initial ramp voltage before the final CDS difference voltage is generated. In that case, the analog-to-digital converter includes a comparator that compares the input voltage at the output node to the initial ramp voltage.

Also in that case, the controller controls the switching network to couple the N capacitors of the first set in parallel and to couple the N capacitors of the second set in parallel for generating the input voltage that is the initial CDS difference voltage offset from the initial ramp voltage, during a signal sampling period. Additionally, the controller controls the switching network to couple the N capacitors of the first set in series and to couple the N capacitors of the second set in series for generating the input voltage that is the final CDS difference voltage offset from the initial ramp voltage, after the signal sampling period.

The present invention may be used to particular advantage when the image sensing device is of a CIS (CMOS image sensor) type. However, the present invention may also be used for correlated double sampling with amplification in any other type of image sensing devices.

In this manner, the correlated double sampling is performed with amplification for the resulting final CDS difference voltage. When such a final CDS difference voltage is input to the analog to digital converter, S/N ratio is improved for the analog to digital conversion of the final CDS difference voltage that has been amplified.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Figure 1:
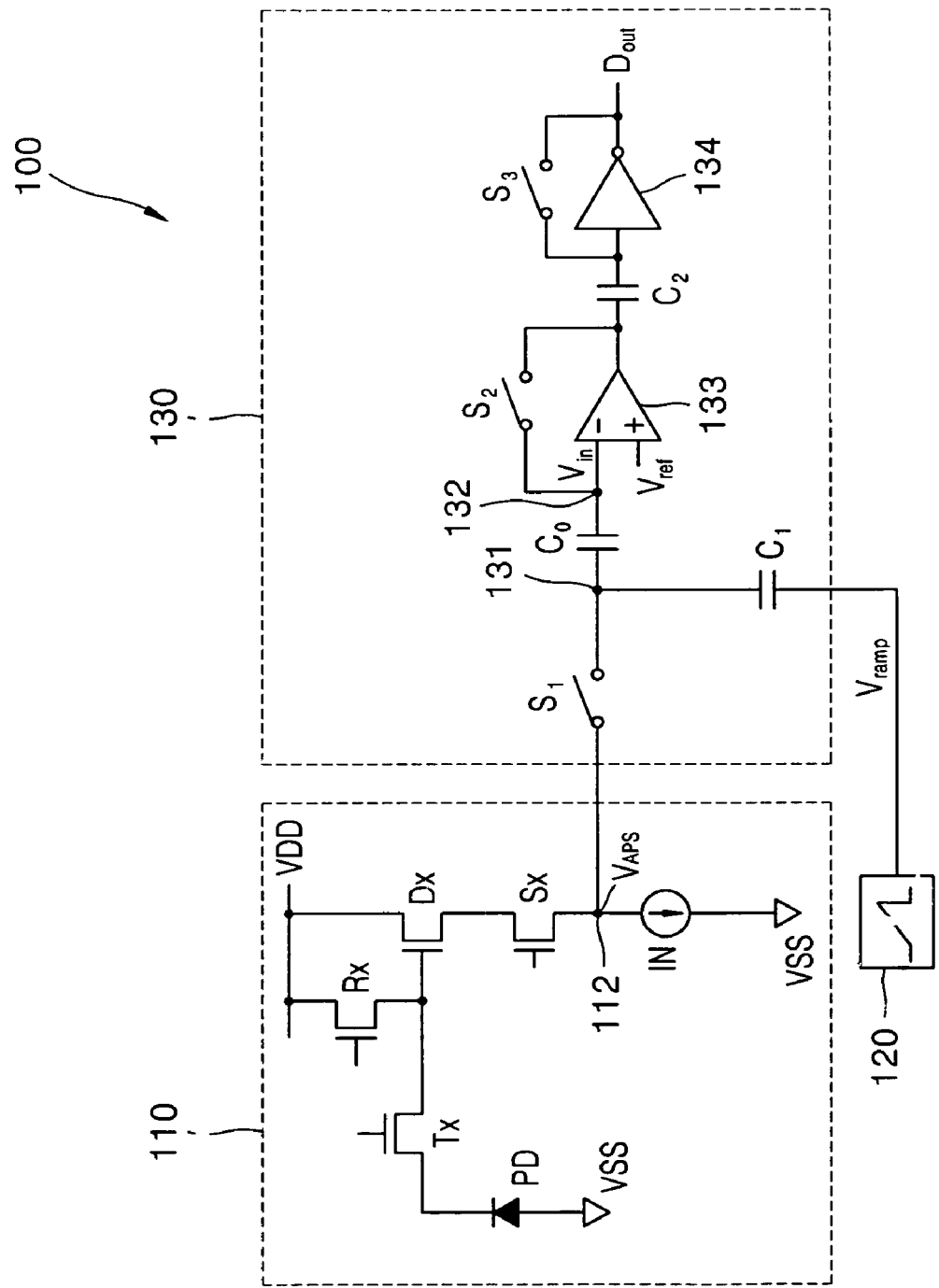
FIG. 1 illustrates a unit block of a typical complementary metal oxide semiconductor (CMOS) image sensor converting a single pixel signal to a digital signal, according to the prior art.

FIG. 1 illustrates a unit block 100 of a typical complementary metal oxide semiconductor (CMOS) image sensor. Referring to FIG. 1, the unit block 100 of the CMOS image sensor uses a column analog-to-digital converter (ADC) technique and includes a unit active pixel sensor (APS) pixel 110, a ramp signal generator 120, and an analog to digital converter (ADC) 130.

As is well known in the pertinent art, the unit APS pixel 110 includes a photodiode PD, multiple transistors Tx, Rx, Dx, and Sx, and a current source IN. The photodiode PD accumulates charge carriers in response to light received from the outside. A transmission transistor Tx transmits the accumulated charge carriers from the photodiode PD to the gate of a source-follower transistor Dx.

A reset transistor Rx transmits a reset voltage (VDD) to the gate of the source-follower transistor Dx, a selection transistor Sx transmits a voltage generated from the source-follower transistor Dx to a node 112, and the current source IN acts as a biased load at the node 112. A pixel voltage signal $V_{APS}$ is generated on the node 112.

The ramp signal generator 120 generates an analog ramp voltage, $V_{ramp}$. The ADC 130 includes a comparator 133, an inverter 134, multiple switches S1, S2, and S3, and multiple capacitors C0, C1, and C2. The ADC 130 receives the pixel voltage signal $V_{APS}$ from the APS pixel 110 which includes a reset voltage $V_{res}$ and an image signal voltage $V_{sig}$ to performs correlated double sampling (CDS) from such voltages, and generates a digital signal $D_{out}$ from comparison to a reference voltage $V_{ref}$. In this regard, the ADC 130 serves as both a correlated double sampler and an analog-to-digital converter.

Figure 2:
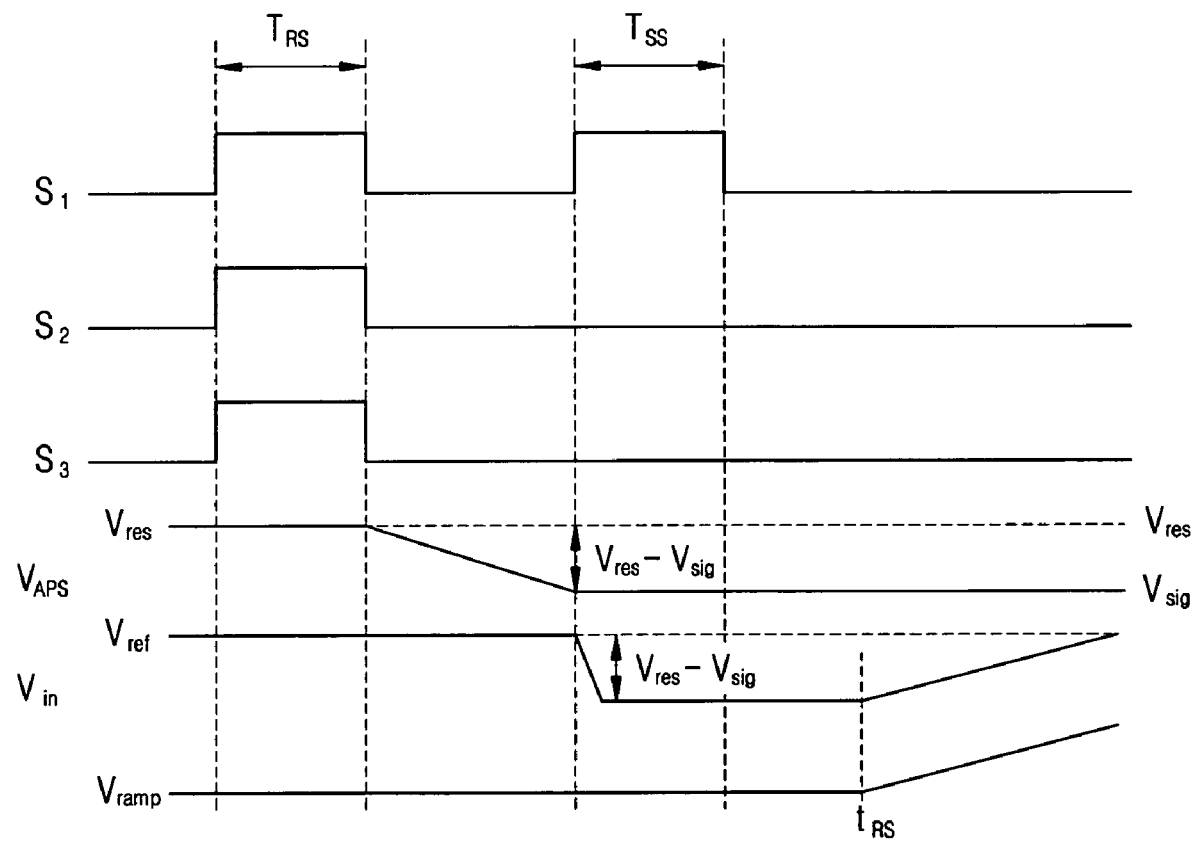
FIG. 2 is an operation timing chart of the unit block of the CMOS image sensor of FIG. 1, according to the prior art.

FIG. 2 is an operation timing chart of the unit block of the CMOS image sensor of FIG. 1. Referring to FIGS. 1 and 2, the unit APS pixel 110 generates the reset voltage $V_{res}$ prior to a reset sampling period $T_{RS}$.

During the reset sampling period $T_{RS}$ in which reset sampling is performed, the switches S1, S2, and S3 are turned-on. Therefore, an output voltage of the comparator 133, i.e., the reference voltage $V_{ref}$ is applied to a node 132, and a charge corresponding to a difference between the reset voltage $V_{res}$ and an input voltage $V_{in}$ at the node 132 is stored in the capacitor $C_0$.

During the period before a signal sampling period $T_{SS}$, the pixel voltage signal $V_{APS}$ is reduced by an image signal voltage $V_{sig}$ from the reset voltage $V_{res}$. The image signal voltage $V_{sig}$ is proportional to the intensity of light received at the photodiode PD. Such a difference between the reset voltage $V_{res}$ and an image signal voltage $V_{sig}$ is a CDS (correlated double sampling) difference voltage, ($V_{res}-V_{sig}$).

During the signal sampling period $T_{SS}$ in which signal sampling is performed, the input voltage $V_{in}$ at the node 132 is the CDS difference voltage offset from the reference voltage $V_{ref}$. Thereafter, the comparator 133 compares the voltage $V_{in}$ of a first input terminal and the voltage $V_{ref}$ of a second input terminal and outputs a logic "low" or "high" signal corresponding to the comparison result.

From the time $t_{RS}$ after the CDS is completed, the voltage $V_{in}$ of the node 132 increases in parallel to a ramp voltage $V_{ramp}$ output from the ramp signal generator 120. When the voltage $V_{in}$ of the node 132 is greater than the reference voltage $V_{ref}$, the output voltage of the comparator 132 is a logic "high", and when the voltage $V_{in}$ of the node 132 is less than the reference voltage $V_{ref}$, the output voltage of the comparator 132 is a logic "low".

With the voltage $V_{in}$ of the node 132 ramping up, if the output voltage $D_{out}$ of the ADC 130 is sampled with time, the logic high or low levels from such sampling generates the digital signal from the ADC 130. Note that the larger the image signal voltage $V_{sig}$, the longer $V_{in}$ remains less than $V_{ref}$ for a higher number of logic low bits in the digital signal.

By using the CDS difference voltage, ($V_{res}-V_{sig}$), the unit block 100 of the CMOS image sensor removes noise that is common in the reset voltage $V_{res}$ and the image signal voltage $V_{sig}$, thereby improving the S/N ratio of the CMOS image sensor. The unit block 100 of the CMOS image sensor has other advantages such as simple construction and low power consumption. However, as the size of the unit APS pixel 110 decreases, the range of the CDS difference voltage ($V_{res}-V_{sig}$) decreases, which worsens the S/N ratio of the ADC 130.

That is, when the ADC 130 is an N-bit ADC, as the CDS difference voltage ($V_{res}-V_{sig}$) applied as the input voltage $V_{in}$ at the node 132 decreases, an incremental voltage step of ($V_{res}-V_{sig}$) divided by $2^N$ decreases. Therefore, the ADC 130 is more susceptible to external noise, which makes it difficult to accomplish a high resolution.

Figure 3:
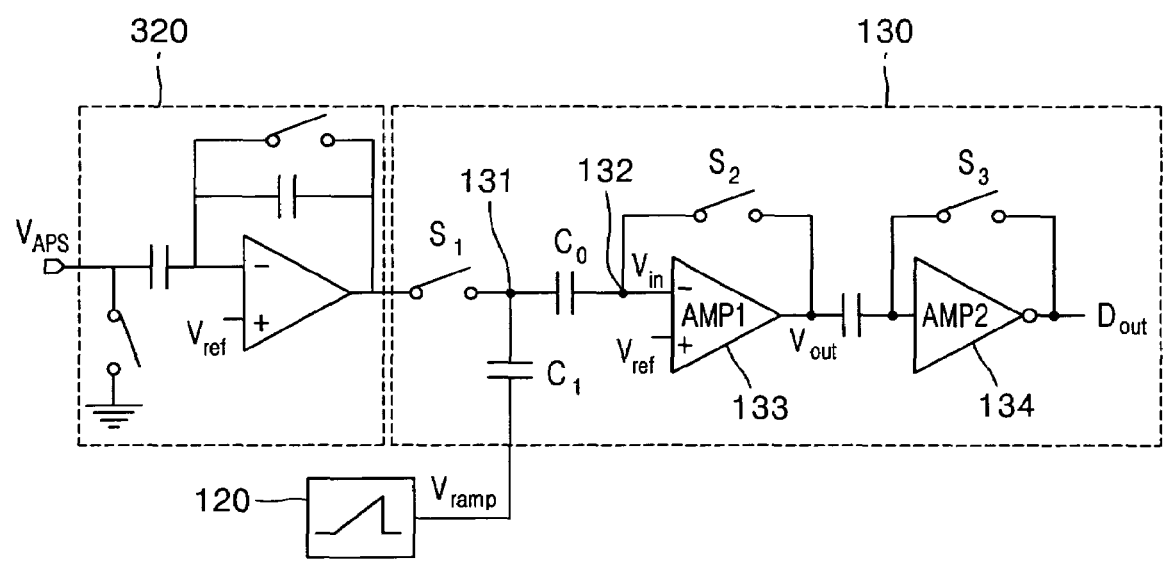
FIG. 3 illustrates a unit block of a typical CMOS image sensor including a pre-amplifier, according to the prior art.

FIG. 3 illustrates a unit block of a typical CMOS image sensor including a pre-amplifier 320. The unit block of the CMOS image sensor of FIG. 3 has been made in view of the problems of the unit block 100 of the CMOS image sensor of FIG. 1. Referring to FIGS. 1 and 3, the unit block of the CMOS image sensor of FIG. 3 further includes a pre-amplifier 320 for amplifying the pixel voltage signal $V_{APS}$ from the unit APS pixel 110.

The pre-amplifier 320 amplifies the pixel voltage signal $V_{APS}$ resulting in amplification of the CDS difference voltage, ($V_{res}-V_{sig}$) applied as the input signal $V_{in}$ of the comparator 133. Therefore, the unit block of the CMOS image sensor of FIG. 3 has higher signal conversion resolution. However, the area and power consumption of the unit block of the CMOS image sensor of FIG. 3 are increased from presence of the pre-amplifier 320.

Figure 4:
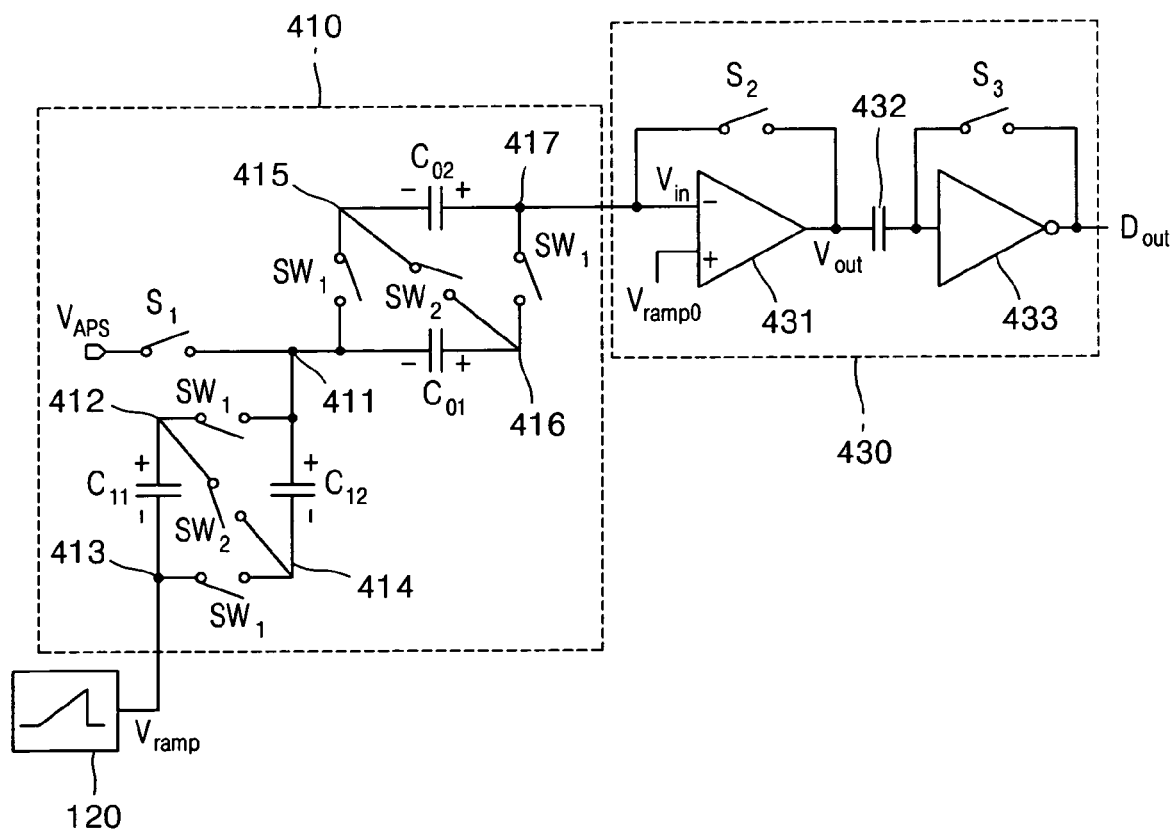
FIG. 4 is a partial view that illustrates a unit block of a CMOS image sensor including a correlated double sampling (CDS) amplifier, according to an embodiment of the present invention.

The present invention has been made in view of these problems of the unit blocks of the CMOS image sensors of FIGS. 1 and 3. FIG. 4 illustrates a unit block of a CMOS image sensor including a CDS (correlated double sampling) amplifier 410 according to an embodiment of the present invention. Referring to FIG. 4, the unit block of the CMOS image sensor includes a ramp signal generator 120, the CDS amplifier 410, and an ADC (analog to digital converter) 430.

Figure 7:
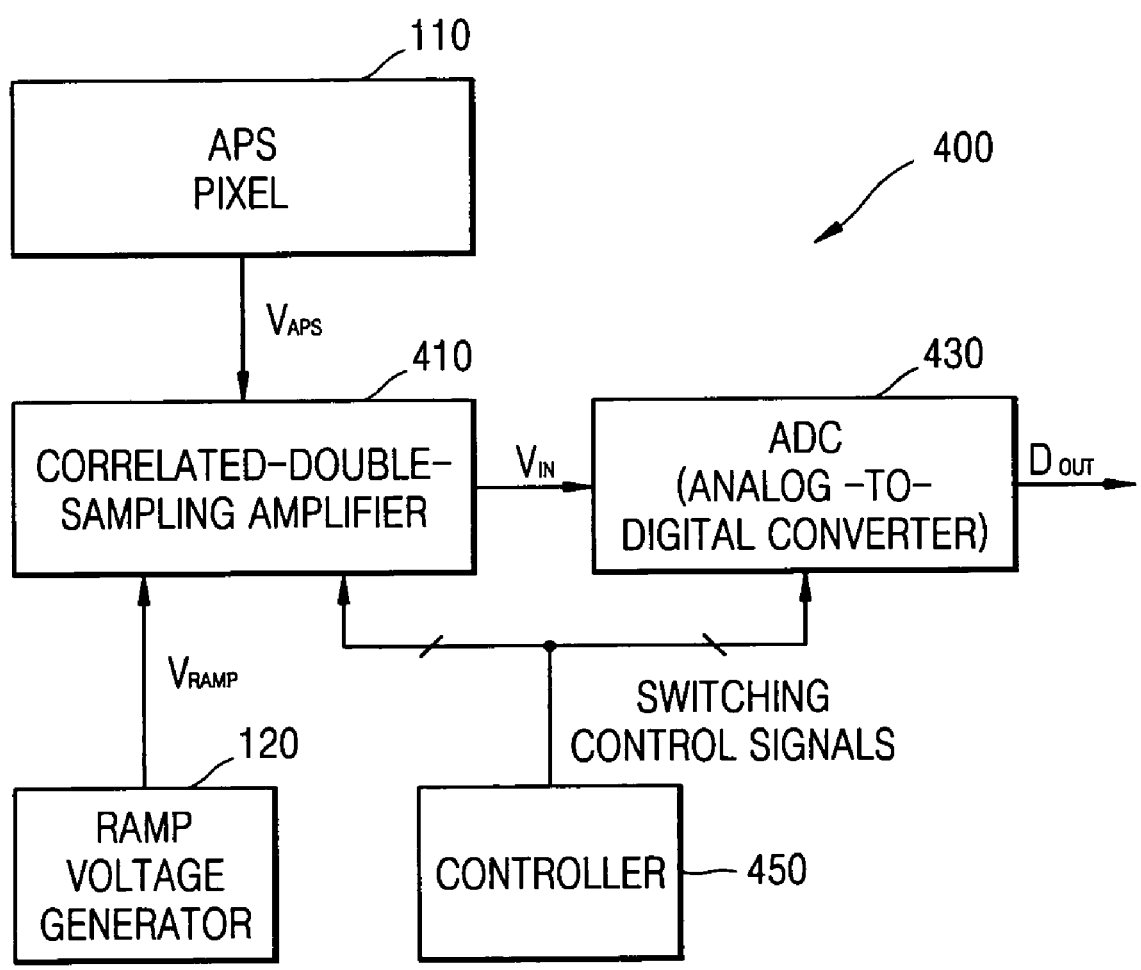
FIG. 7 shows a block diagram of an image sensing device including the components of FIG. 4, according to an embodiment of the present invention.

FIG. 7 shows a block diagram of an image sensing device 400 including such elements 120, 410, and 430 of FIG. 4. The image sensing device 400 further includes an APS pixel 110 similar to such a pixel 110 of FIG. 1 that generates the pixel voltage signal $V_{APS}$. The pixel voltage signal $V_{APS}$ is applied on the CDS amplifier 410. The CDS amplifier 410 has an output node 417 for generating a final CDS difference voltage applied as an input voltage $V_{in}$ of the ADC 430. In addition, the image sensing device 400 includes a controller 450 for generating switching control signals that control turning on or off of each switch within the CDS amplifier 410.

The ramp signal generator 120 generates a ramp signal $V_{ramp}$ that is applied on a node 413 of the CDS amplifier 410. The CDS amplifier 410 includes a plurality of capacitors $C_{11}$, $C_{12}$, $C_{01}$, and $C_{02}$, and a plurality of switches $S_1$, $SW_1$, and $SW_2$ that form a switching network. The capacitors $C_{11}$ and $C_{12}$ form a first set of capacitors coupled between the ramp signal generator 120 and the APS pixel 110 via a pixel sampling switch S1. The capacitors $C_{01}$ and $C_{02}$ form a second set of capacitors coupled between the ADC 430 and the APS pixel 110 via the pixel sampling switch S1.

Switches SW1 are coupled among the first set of capacitors $C_{11}$ and $C_{12}$ such that such capacitors $C_{11}$ and $C_{12}$ are coupled in parallel when such switches SW1 are closed. Similarly, switches SW1 are coupled among the second set of capacitors $C_{01}$ and $C_{02}$ such that such capacitors $C_{01}$ and $C_{02}$ are coupled in parallel when such switches SW1 are closed.

In contrast, a switch SW2 is coupled among the first set of capacitors $C_{11}$ and $C_{12}$ such that such capacitors $C_{11}$ and $C_{12}$ are coupled in series when such a switch SW2 is closed. Similarly, a switch SW2 is coupled among the second set of capacitors $C_{01}$ and $C_{02}$ such that such capacitors $C_{01}$ and $C_{02}$ are coupled in series when such switch SW2 is closed.

The ADC 430 includes a comparator 431, an inverter 433, a capacitor 432, and two switches $S_2$ and $S_3$. The comparator 431 receives a voltage output from the output node 417 of the CDS amplifier 410 and a reference voltage $V_{ramp0}$, compares the two voltages, and outputs the comparison result to the capacitor 432. The inverter 433 inverts an output signal of the comparator 431 received through the capacitor 432 and outputs the result. Here, an output $D_{out}$ of the inverter 433 is logic "high" or "low".

Figure 5:
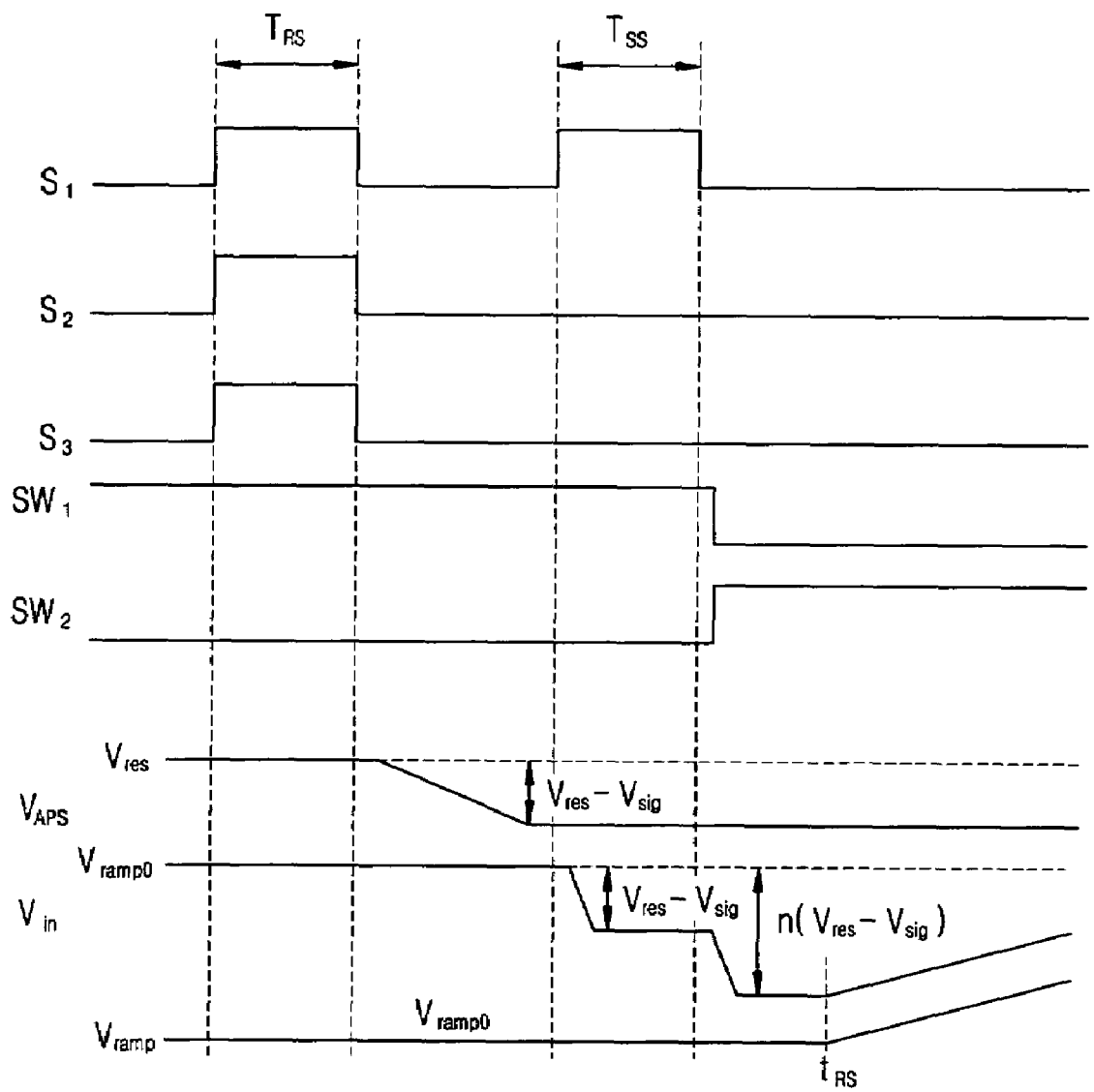
FIG. 5 is an operation timing chart of the unit block of the CMOS image sensor of FIG. 4, according to an embodiment of the present invention.

FIG. 5 is an operation timing chart of the unit block of the CMOS image sensor of FIG. 4. The operation of the CMOS image sensor of FIG. 4 will now be described with reference to FIG. 5.

During a reset sampling period $T_{RS}$ in which reset sampling is performed, the switches $S_1$, $S_2$, $S_3$, and $SW_1$ are turned-on and the switches $SW_2$ are turned-off. Referring to FIGS. 4, 5 and 7, the controller 450 of FIG. 7 generates the switch control signals $S_1$, $S_2$, $S_3$, $SW_1$, and $SW_2$ of FIG. 5 for controlling the on or off configuration of each of the switches $S_1$, $S_2$, $S_3$, $SW_1$, and $SW_2$ of FIG. 4.

At this time, since the capacitors $C_{01}$ and $C_{02}$ are connected in parallel, a charge corresponding to a difference ($V_{ramp0} - V_{res}$) between the reference voltage $V_{ramp0}$ and a reset voltage $V_{res}$ is stored in each of the capacitors $C_{01}$ and $C_{02}$. Here, the reference voltage $V_{ramp0}$ is correlated with the output voltage $V_{ramp}$ of the ramp signal generator 120 and indicates an initial ramp voltage $V_{ramp0}$ of the ramp signal generator 120.

During a signal sampling period $T_{SS}$ in which signal sampling is performed, the switches $S_1$ and $SW_1$ are turned-on and the switches $S_2$, $S_3$, and $SW_2$ are turned-off. At this time, since the capacitors $C_{11}$ and $C_{12}$ are connected in parallel, a charge corresponding to a difference ($V_{sig} - V_{ramp0}$) between a signal voltage $V_{sig}$ and the reference voltage $V_{ramp0}$ is stored in each of the capacitors $C_{11}$ and $C_{12}$.

The voltage $V_{in}$ generated at the node 417 during signal sampling includes an initial CDS difference voltage ($V_{res} - V_{sig}$) as shown in Equation 1 below:

$$V_{in} = V_{ramp0} + (V_{sig} - V_{ramp0}) + (V_{ramp0} - V_{res}) = V_{ramp0} - (V_{res} - V_{sig}) \quad (1)$$

After the signal sampling, the switches $S_1$ and $SW_1$ are turned-off and the switches $SW_2$ are turned-on. Therefore, the capacitors $C_{11}$, $C_{12}$, $C_{01}$, and $C_{02}$ are serially connected. At this time, the voltage $V_{in}$ generated at the node 417 includes a final CDS difference voltage $2(V_{res} - V_{sig})$ as shown in Equation 2 below:

$$V_{in} = V_{ramp0} + 2(V_{sig} - V_{ramp0}) + 2(V_{ramp0} - V_{res}) = V_{ramp0} - 2(V_{res} - V_{sig}) \quad (2)$$

Referring to Equations 1 and 2, the final CDS difference voltage $2(V_{res} - V_{sig})$ that indicates the intensity of light received at the APS pixel 110 and that is converted by the ADC 430 is amplified by a factor of 2 from the initial CDS difference voltage ($V_{res} - V_{sig}$). Thus, the CDS amplifier 410 advantageously leads to higher signal conversion resolution. Furthermore, with the CDS amplifier 410, a pre-amplifier for amplifying the pixel voltage signal $V_{APS}$ is not used such that the image sensing device 400 has smaller layout area and lower power consumption.

Figure 6:
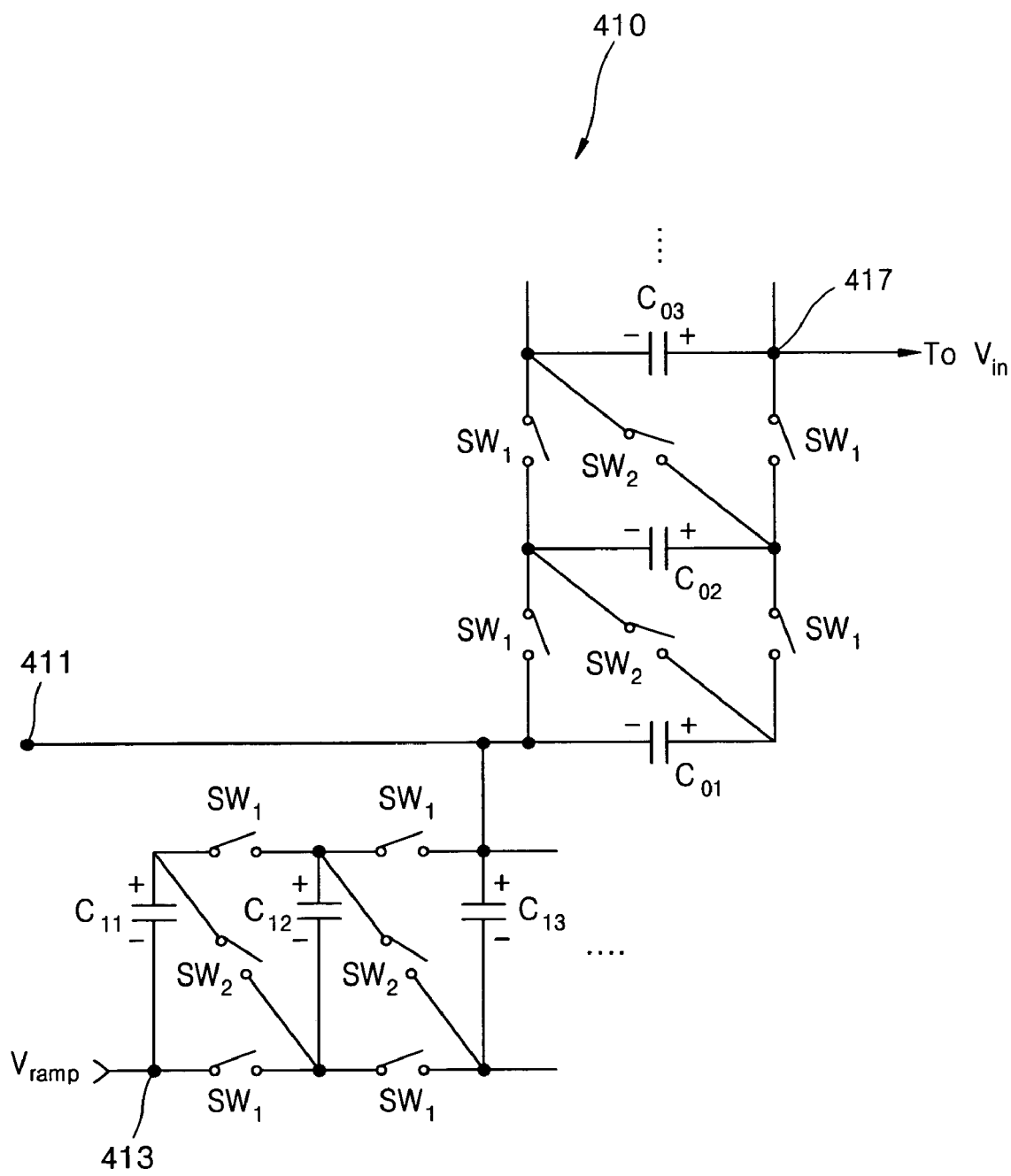
FIG. 6 shows a CDS amplifier for amplifying a CDS difference voltage by a general factor of N, according to an embodiment of the present invention.

FIG. 6 shows a CDS amplifier 410 for amplifying a CDS difference voltage by a general factor of N, according to another embodiment of the present invention. In that case, the first set of capacitors $C_{11}$, $C_{12}$, $C_{13}$, ..., and $C_{1N}$ is comprised of N capacitors, and the second set of capacitors $C_{01}$, $C_{02}$, $C_{03}$, ..., and $C_{0n}$ is comprised of N capacitors.

The switches $SW_1$ are closed (with the switches $SW_2$ being open) to connect the first set of capacitors $C_{11}$, $C_{12}$, $C_{13}$, ..., and $C_{1N}$ in parallel and to connect the second set of capacitors $C_{01}$, $C_{02}$, $C_{03}$, ..., and $C_{0n}$ in parallel, during the signal sampling. In addition, the switches $SW_2$ are closed (with the switches $SW_1$ being open) to then connect the first set of capacitors $C_{11}$, $C_{12}$, $C_{13}$, ..., and $C_{1N}$ in series and to connect the second set of capacitors $C_{01}$, $C_{02}$, $C_{03}$, ..., and $C_{0n}$ in series, after the signal sampling.

Therefore, the voltage $V_{in}$ generated at the node 417 after the signal sampling is expressed as follows in Equation 3:

$$V_{in} = V_{ramp0} + N(V_{sig} - V_{ramp0}) + N(V_{ramp0} - V_{res}) = V_{ramp0} - N(V_{res} - V_{sig}) \quad (3)$$

In this manner, the CDS amplifier 410 performs correlated doubling sampling along with amplification of such correlated doubling sampling. When the final CDS difference voltage $N(V_{res} - V_{sig})$ is input to the ADC 430, S/N ratio is improved in the analog to digital conversion of the final CDS difference voltage $N(V_{res} - V_{sig})$ that has been amplified N-fold. Therefore, CDS amplifier 410 leads to higher signal conversion resolution for the image voltage signal with a small layout area and low power consumption of the image sensing device 400.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, any numbers of elements or circuit topology illustrated and described herein are by way of example only. In addition, the present invention has been described for the image sensing device of a CIS (CMOS image sensor) type. However, the present invention may also be used for correlated double sampling with amplification in any other type of image sensing devices. The present invention is limited only as defined in the following claims and equivalents thereof.

What is claimed is:

1. A correlated double sampling (CDS) amplifier, comprising:
   a plurality of capacitors; and
   a switching network coupled to the plurality of capacitors and to a pixel of an image sensing device;
   wherein the switching network is configured to couple the capacitors in parallel as an initial CDS difference voltage is generated, and then is configured to couple the capacitors in series for generating a final CDS difference voltage that is a multiple of the initial CDS difference voltage,
   and wherein the initial and final CDS difference voltages are determined for a signal sampling from said one pixel of the image sensing device,
   and wherein the initial CDS difference voltage is a difference between a reset voltage and an image signal voltage for the pixel.

2. The CDS amplifier of claim 1, wherein the final CDS difference voltage is N times the initial CDS difference voltage, with N being an integer.

3. The CDS amplifier of claim 2, wherein the plurality of capacitors includes:
   a first set of N capacitors coupled to a ramp signal generator and to the pixel; and
   a second set of N capacitors coupled to the pixel and an output node that generates an input voltage to an analog-to-digital converter;
   and wherein the switching network includes:
   a pixel sampling switch coupled between the pixel and each of the first and second set of N capacitors.

4. The CDS amplifier of claim 3, wherein the ramp signal generator generates an initial ramp voltage until the final CDS difference voltage is generated.

5. The CDS amplifier of claim 4, wherein a controller controls the switching network to couple the N capacitors of the first set in parallel and to couple the N capacitors of the second set in parallel for generating at the output node the initial CDS difference voltage offset from the initial ramp voltage, during a signal sampling period.

6. The CDS amplifier of claim 5, wherein the controller controls the switching network to couple the N capacitors of the first set in series and to couple the N capacitors of the second set in series for generating at the output node the final CDS difference voltage offset from the initial ramp voltage, after the signal sampling period.

7. The CDS amplifier of claim 1, wherein the image sensing device is of a CMOS image sensor (CIS) type.

8. An image sensing device, comprising:
   a pixel for generating a reset voltage and an image signal voltage;
   a correlated double sampling (CDS) amplifier for generating an initial CDS difference voltage from the reset voltage and the image signal voltage, and for generating a final CDS difference voltage that is a multiple of the initial CDS difference voltage,
   and wherein the initial and final CDS difference voltages are determined for a signal sampling from said one pixel of the image sensing device; and
   an analog-to-digital converter for converting the final CDS difference voltage that is an analog signal into a digital signal,
   wherein the CDS amplifier includes:
   a plurality of capacitors; and
   a switching network coupled to the plurality of capacitors and to the pixel;
   and wherein the image sensing device further includes:
   a controller for configuring the switching network to couple the capacitors in parallel as the initial CDS difference voltage is generated, and then to couple the capacitors in series for generating the final CDS difference voltage.

9. The image sensing device of claim 8, wherein the final CDS difference voltage is N times the initial CDS difference voltage, with N being an integer.

10. The image sensing device of claim 9, wherein the plurality of capacitors includes:
    a first set of N capacitors coupled to a ramp signal generator and to the pixel; and
    a second set of N capacitors coupled to the pixel and an output node that generates an input voltage for the analog-to-digital converter;
    and wherein the switching network includes:
    a pixel sampling switch coupled between the pixel and each of the first and second set of N capacitors.

11. The image sensing device of claim 10, wherein the ramp signal generator generates an initial ramp voltage before the final CDS difference voltage is generated, and wherein the analog-to-digital converter includes a comparator that compares the input voltage at the output node to the initial ramp voltage.

12. The image sensing device of claim 11,
    wherein the controller controls the switching network to couple the N capacitors of the first set in parallel and to couple the N capacitors of the second set in parallel for generating the input voltage that is the initial CDS difference voltage offset from the initial ramp voltage, during a signal sampling period;
    and wherein the controller controls the switching network to couple the N capacitors of the first set in series and to couple the N capacitors of the second set in series for generating the input voltage that is the final CDS difference voltage offset from the initial ramp voltage, after the signal sampling period.

13. The image sensing device of claim 8, wherein the image sensing device is of a CMOS image sensor (CIS) type.

14. A method for correlated double sampling (CDS) within an image sensing device, comprising:
    configuring a switching network to couple respective capacitors within each of a plurality of sets in parallel as an initial CDS difference voltage is generated for a pixel; and
    configuring the switching network to couple the respective capacitors within each of the sets in series for generating a final CDS difference voltage that is a multiple of the initial CDS difference voltage,
    and wherein the initial and final CDS difference voltages are determined for a signal sampling from said one pixel of the image sensing device,
    and wherein the initial CDS difference voltage is a difference between a reset voltage and an image signal voltage for the pixel.

15. The method of claim 14, wherein the plurality of sets includes a first set of N capacitors coupled to a ramp signal generator and to the pixel and includes a second set of N capacitors coupled to the pixel and an output node that generates an input voltage to an analog-to-digital converter, and wherein the switching network includes a pixel sampling switch coupled between the pixel and each of the first and second set of N capacitors.

16. The method of claim 15, wherein the ramp signal generator generates an initial ramp voltage until the final CDS difference voltage is generated, and the method further comprising:

configuring the switching network to couple the N capacitors of the first set in parallel and to couple the N capacitors of the second set in parallel for generating at the output node the initial CDS difference voltage offset from the initial ramp voltage, during a signal sampling period; and configuring the switching network to couple the N capacitors of the first set in series and to couple the N capacitors of the second set in series for generating at the output node the final CDS difference voltage offset from the initial ramp voltage, after the signal sampling period.

17. The method of claim 14, wherein the image sensing device is of a CMOS image sensor (CIS) type.

* * * * *